United States Patent
Cheung

(10) Patent No.: US 9,786,518 B2
(45) Date of Patent: Oct. 10, 2017

(54) SYSTEM AND METHOD FOR MANUFACTURING A CAVITY DOWN FABRICATED CARRIER

(71) Applicant: Enablink Technologies Limited, Tsuen Wan, Hong Kong (CN)

(72) Inventor: Ka Wa Cheung, Tuen Mun (CN)

(73) Assignee: ENABLINK TECHNOLOGIES LIMITED, Kowloon (HK)

( * ) Notice: Subject to any disclaimer, the term of this patent is extended or adjusted under 35 U.S.C. 154(b) by 273 days.

(21) Appl. No.: 14/561,499

(22) Filed: Dec. 5, 2014

(65) Prior Publication Data

US 2015/0162218 A1    Jun. 11, 2015

Related U.S. Application Data

(60) Provisional application No. 61/912,745, filed on Dec. 6, 2013.

(51) Int. Cl.
*H05K 3/30* (2006.01)
*H01L 21/56* (2006.01)
(Continued)

(52) U.S. Cl.
CPC .......... *H01L 21/56* (2013.01); *H01L 21/4853* (2013.01); *H01L 23/13* (2013.01);
(Continued)

(58) Field of Classification Search
CPC . H01L 21/4846; H01L 21/56; H01L 21/4853; H01L 24/83; H01L 24/11; H01L 2224/8385; H01L 2224/92247; H01L 2224/48091; H01L 2224/73265; H01L 2224/48227; H01L 2924/0665; H01L 2924/15153; H01L 2924/181; H01L 2924/00; H01L 2924/12; H01L 23/13;
(Continued)

(56) References Cited

U.S. PATENT DOCUMENTS 5,422,313 A  *  6/1995  West ..................... H01L 21/565
                                           257/E21.504
6,528,869 B1 *  3/2003  Glenn ................. H01L 21/4853
                                                  219/209

(Continued)

FOREIGN PATENT DOCUMENTS

EP        1 271 644 A1      1/2003

OTHER PUBLICATIONS

Official Communication issued in corresponding European Patent Application No. 14196619.2, mailed on Jul. 9, 2015.

(Continued)

*Primary Examiner* — Peter DungBa Vo
*Assistant Examiner* — Azm Parvez
(74) *Attorney, Agent, or Firm* — Keating and Bennett, LLP

(57) ABSTRACT

A method of fabricating a receptacle down BGA carrier having a top surface and a bottom surface, the method comprising combining a conductive portion and a molded dielectric portion, said dielectric portion having an inner surface intersecting said top surface, said inner surface forming a cavity for receiving a die; selectively etching part of said conductive portion; and applying solder resist to a portion of a top surface of said conductive portion.

6 Claims, 9 Drawing Sheets

(51) Int. Cl.
*H01L 23/00* (2006.01)
*H01L 21/48* (2006.01)
*H01L 23/13* (2006.01)
*H01L 23/498* (2006.01)

(52) U.S. Cl.
CPC .............. *H01L 24/11* (2013.01); *H01L 24/83* (2013.01); *H01L 23/49811* (2013.01); *H01L 23/49816* (2013.01); *H01L 23/49833* (2013.01); *H01L 2224/48091* (2013.01); *H01L 2224/48227* (2013.01); *H01L 2224/73265* (2013.01); *H01L 2224/8385* (2013.01); *H01L 2224/92247* (2013.01); *H01L 2924/0665* (2013.01); *H01L 2924/15153* (2013.01); *H01L 2924/181* (2013.01)

(58) Field of Classification Search
CPC ......... H01L 23/49811; H01L 23/49833; H01L 23/49816
USPC ....... 29/841, 832, 829, 825, 592.1; 174/251; 216/13, 20; 438/122
See application file for complete search history.

(56) References Cited

U.S. PATENT DOCUMENTS

| | | | |
|---|---|---|---|
| 7,064,012 B1 | 6/2006 | Lin | |
| 2004/0175582 A1 | 9/2004 | Brenneman et al. | |
| 2007/0057364 A1* | 3/2007 | Wang | C03C 8/02 257/701 |
| 2009/0102050 A1 | 4/2009 | Hsu | |
| 2010/0044845 A1 | 2/2010 | Funaya et al. | |
| 2010/0288541 A1 | 11/2010 | Appelt et al. | |
| 2012/0020026 A1 | 1/2012 | Oganesian et al. | |
| 2012/0085572 A1 | 4/2012 | Sakai | |
| 2012/0139095 A1* | 6/2012 | Manusharow | H01L 23/36 257/690 |
| 2014/0363927 A1* | 12/2014 | Hurwitz | H05K 1/0298 438/125 |

OTHER PUBLICATIONS

Official Communication issued in related European Patent Application No. 14196621.8, mailed on Apr. 30, 2015.
Official Communication issued in related European Patent Application No. 14196620.0, mailed on Apr. 30, 2015.
Cheung; "System and Method for Manufacturing a Fabricated Carrier"; U.S. Appl. No. 14/561,493, filed Dec. 5, 2014.
Cheung; "System and Method for Manufacturing a Fabricated Carrier"; U.S. Appl. No. 14/561,501, filed Dec. 5, 2014.

* cited by examiner

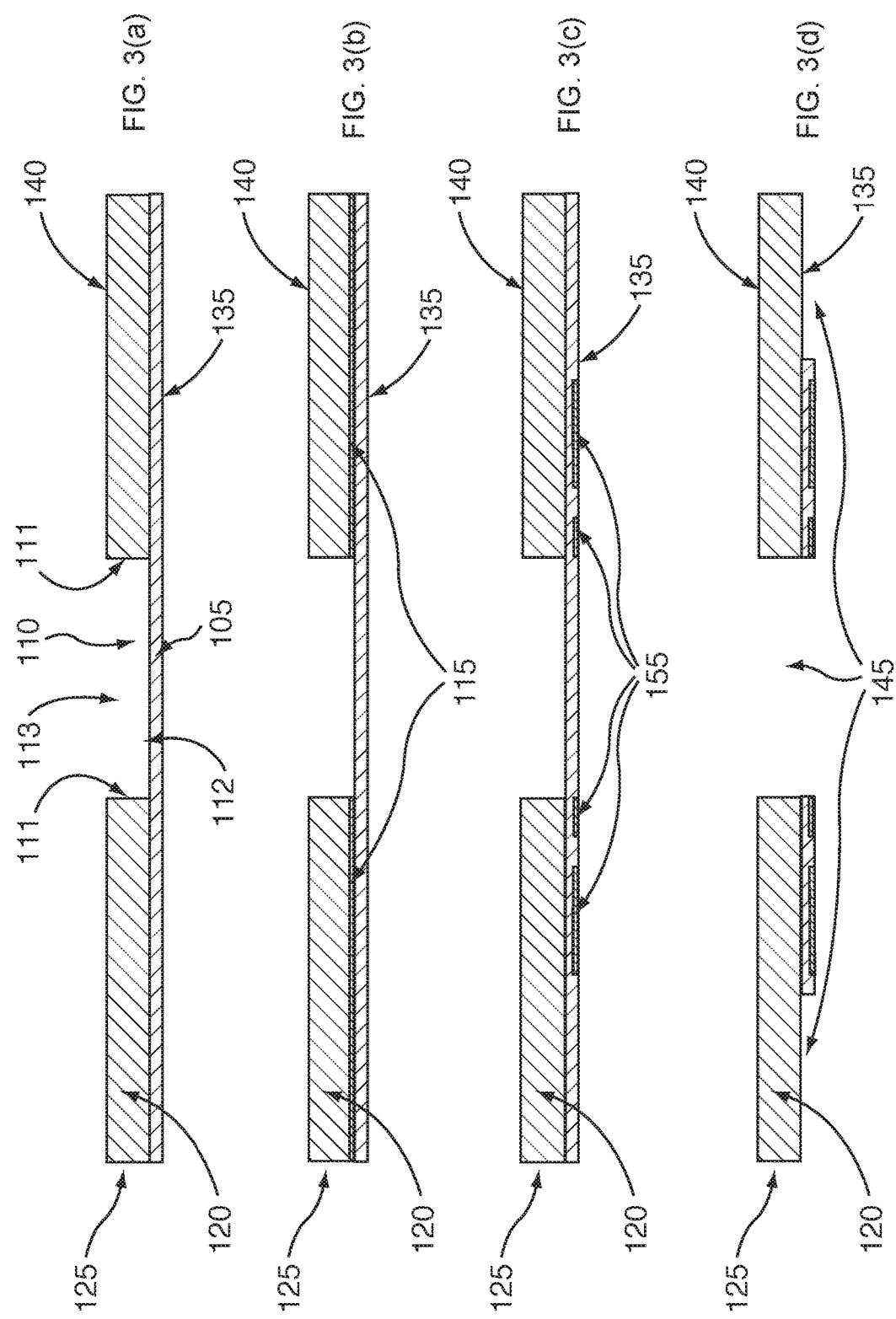

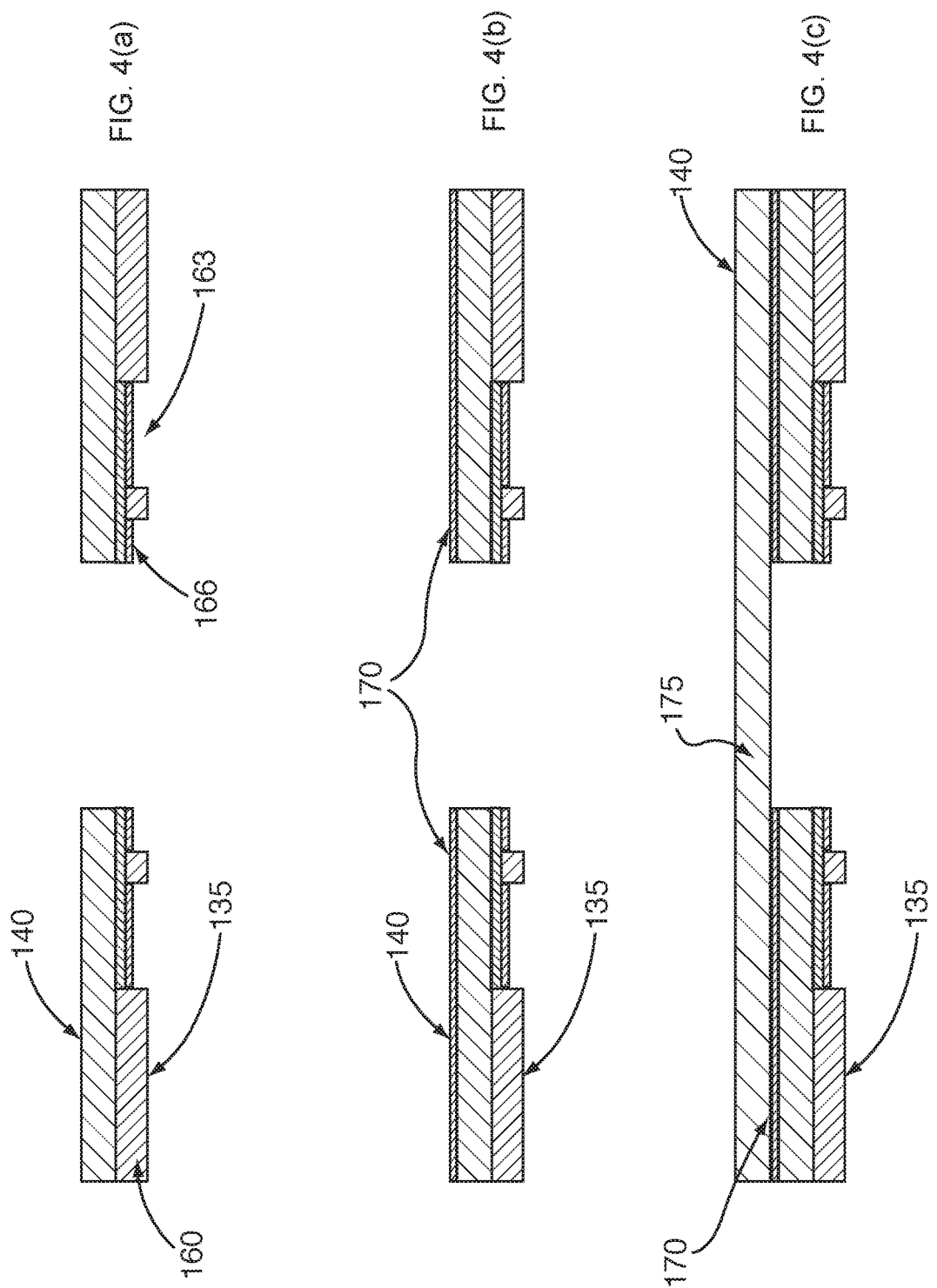

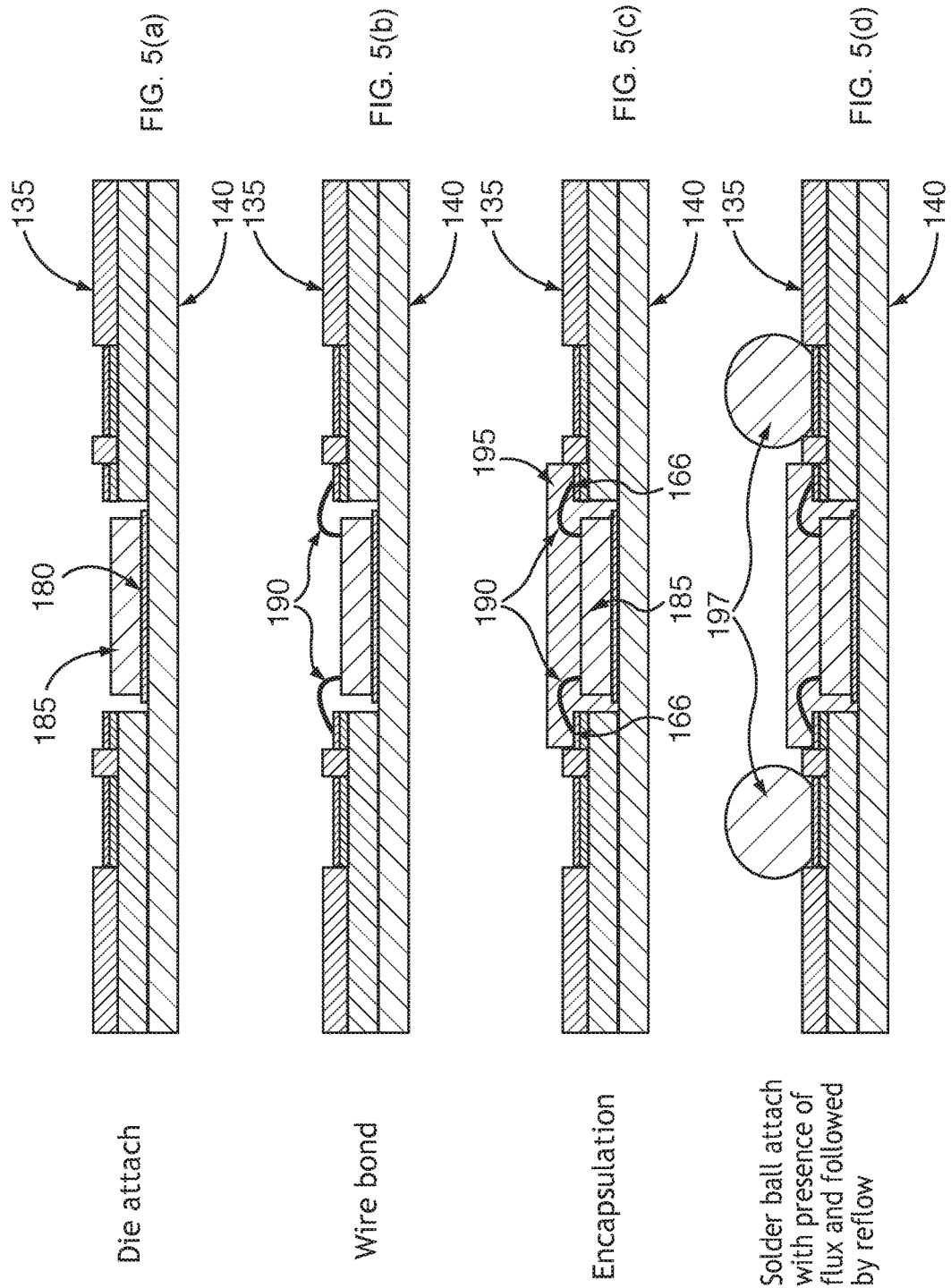

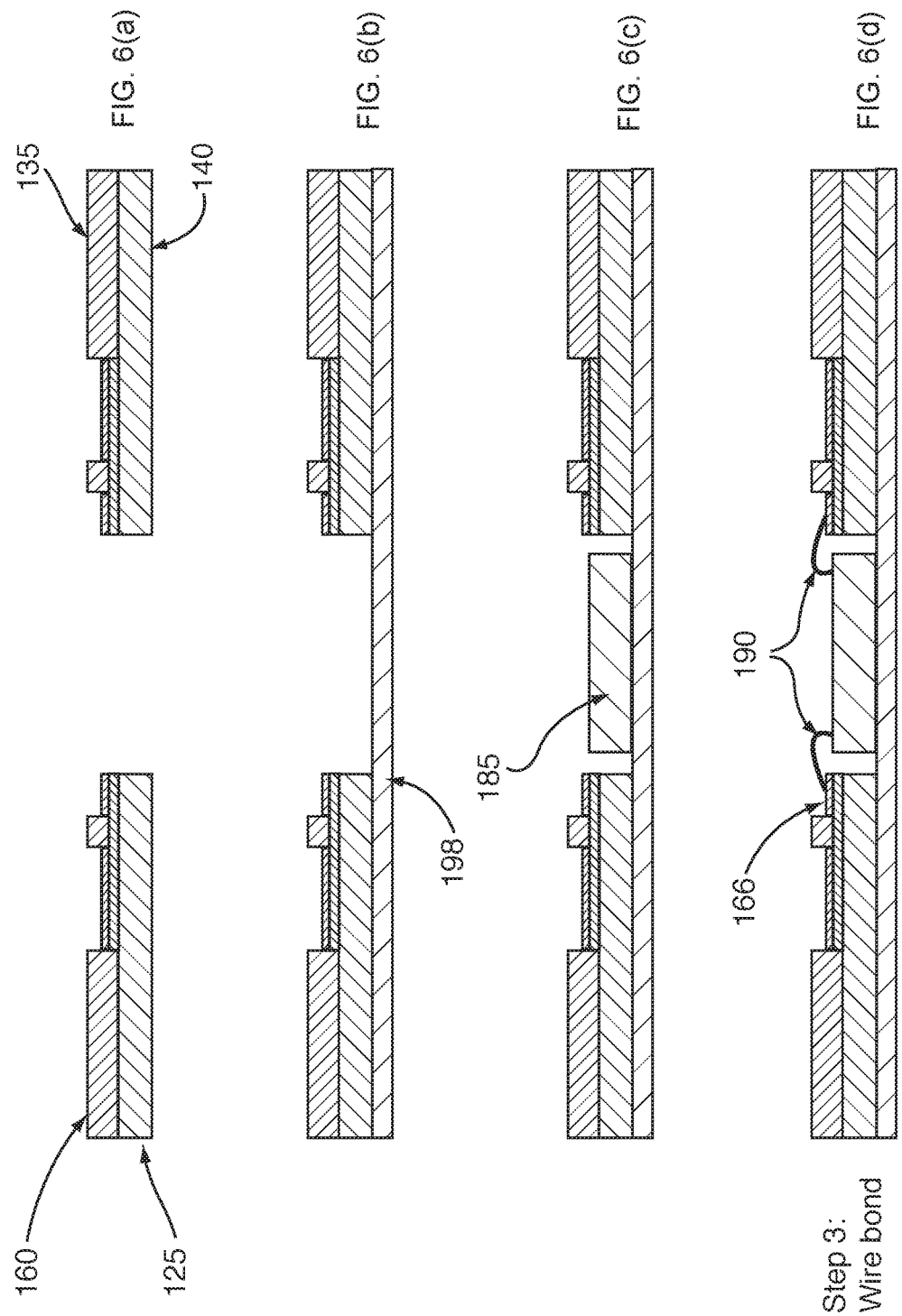

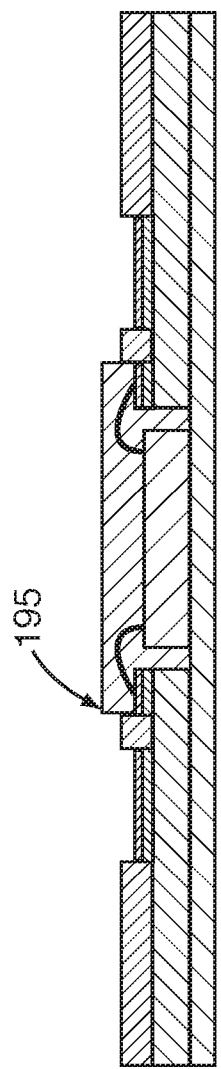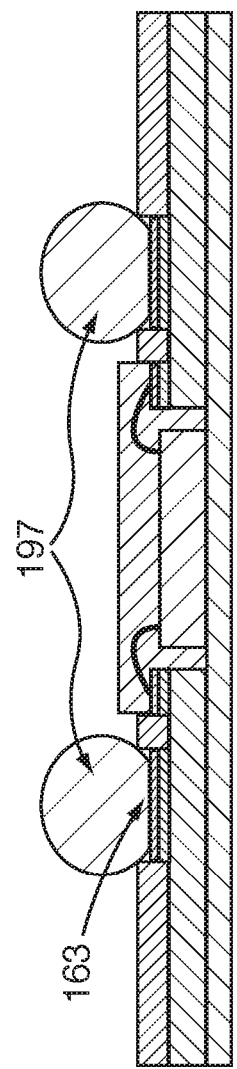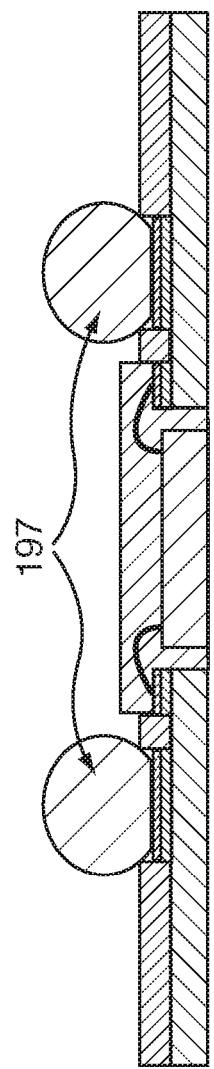

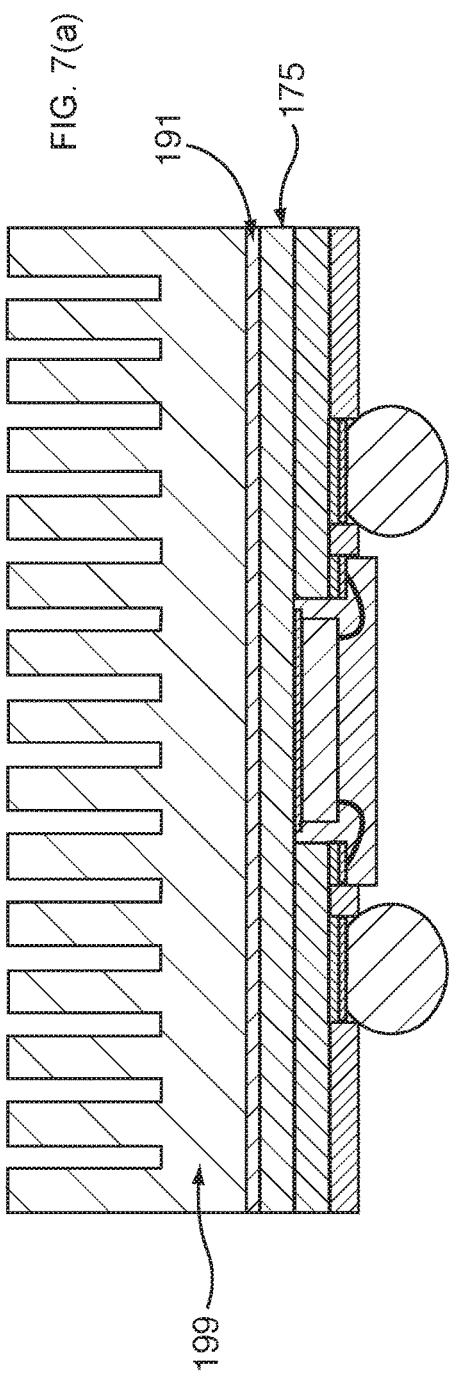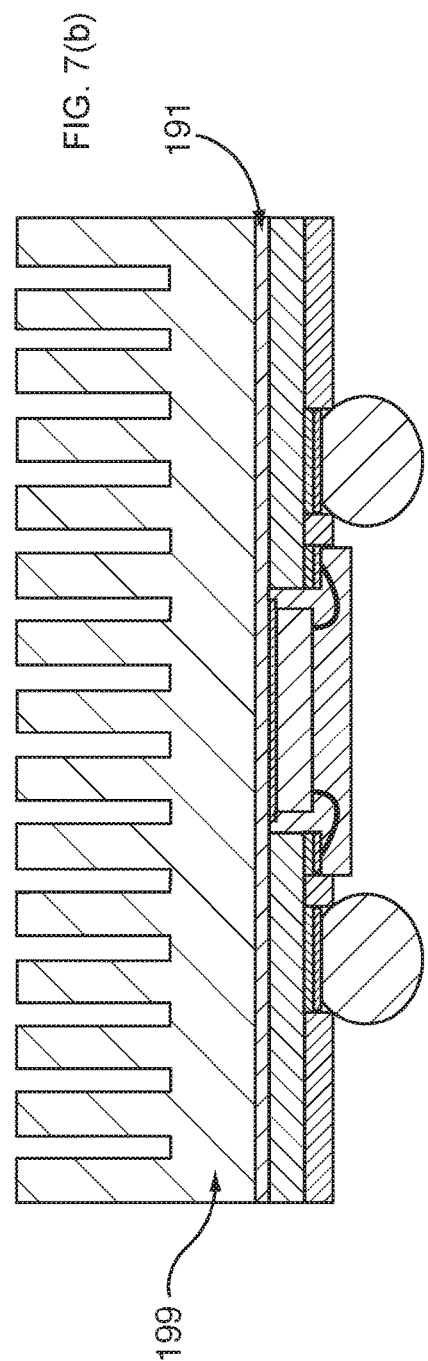

SYSTEM AND METHOD FOR MANUFACTURING A CAVITY DOWN FABRICATED CARRIER

RELATED APPLICATIONS

This application claims priority from U.S. patent application 61/912,745, filed Dec. 6, 2014. Priority is claimed to this earlier filed application and the contents of this earlier filed application are incorporated herein, in its entirety, by reference.

FIELD OF INVENTION

The present invention relates generally to integrated circuit packaging and more particularly to a system and method for fabricating a ball grid array carrier.

BACKGROUND

Various processes exist for forming a fabricated carrier. For example, fabrication can be done by means of fabricating a polyimide carrier laminated with metal foil with the aid of an adhesive layer, followed by patterning the metal and selectively plating the metal portion followed by laminating the polyimide carrier onto a thick metal piece where there is a partially etched cavity aligning with the opening of the polyimide carrier to form the die receptacle. This is not a cost effective way to make such a carrier since the polyimide is relatively expensive. Moreover, polyimide is relatively thin, and in order to create a deep enough receptacle to receive a semiconductor device, a relatively thick metal piece with partially etched cavity is needed and therefore an additional etching step is needed.

SUMMARY

It is an object of an aspect of the invention to provide a novel system and method for fabricating a ball grid array carrier that obviates and mitigates at least one of the above-identified disadvantages of the prior art.

These, together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF DRAWINGS

FIGS. 3(a)-(d) show cross-sectional views of a ball grid carrier being fabricated, in accordance with an embodiment;

FIGS. 4(a)-(c) show cross-sectional views of a ball grid carrier being fabricated, in accordance with an embodiment;

FIGS. 5(a)-(d) show cross-sectional views of a ball grid carrier being assembled with a semiconductor die, in accordance with an embodiment;

FIGS. 6(a)-(g) show cross-sectional views of a ball grid carrier being fabricated and assembled with a semiconductor die, in accordance with another embodiment; and FIGS. 7(a) and (b) show cross-sectional views of and assembled ball grid array carrier in accordance with alternative embodiments.

DETAILED DESCRIPTION

Figure 1A:
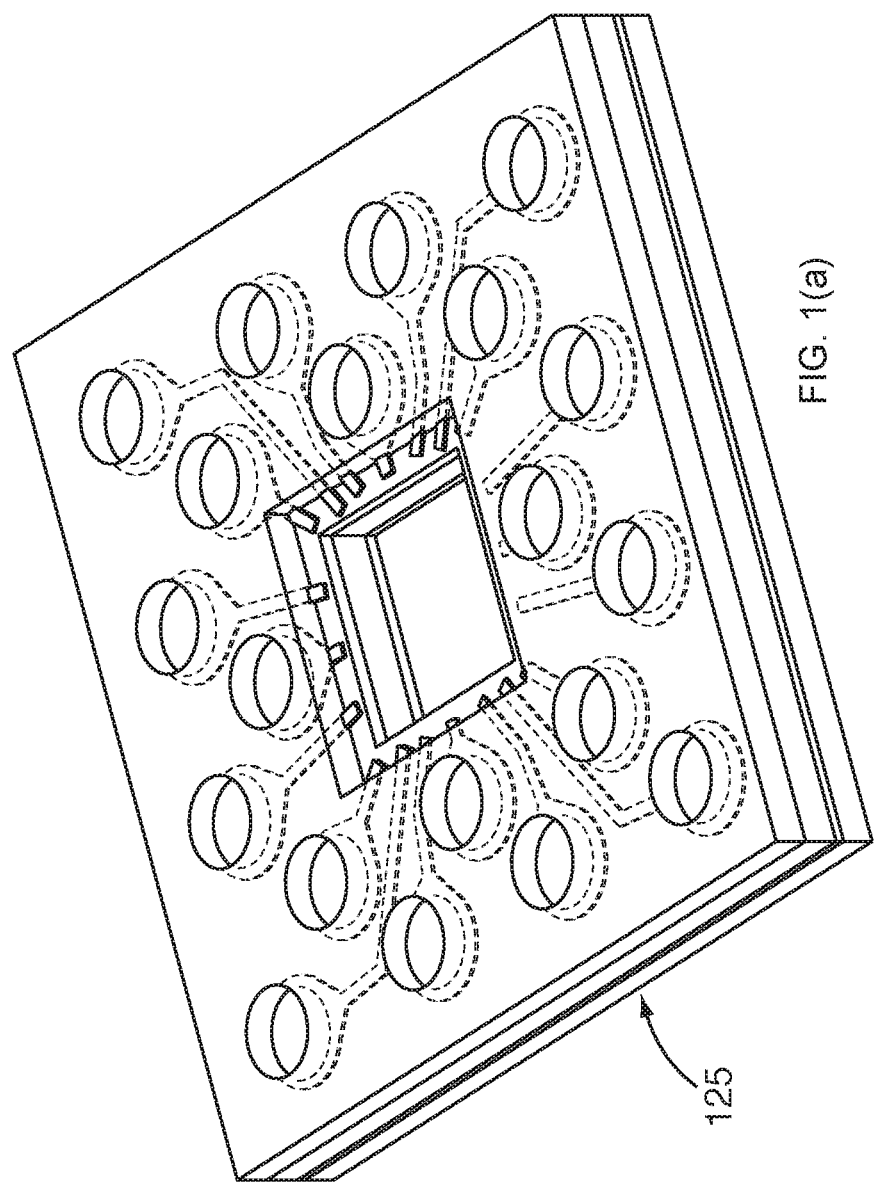
FIGS. 1(a)-(c) show diagrams of a ball grid array carrier in accordance with an embodiment.
Figures 1B, 1C:
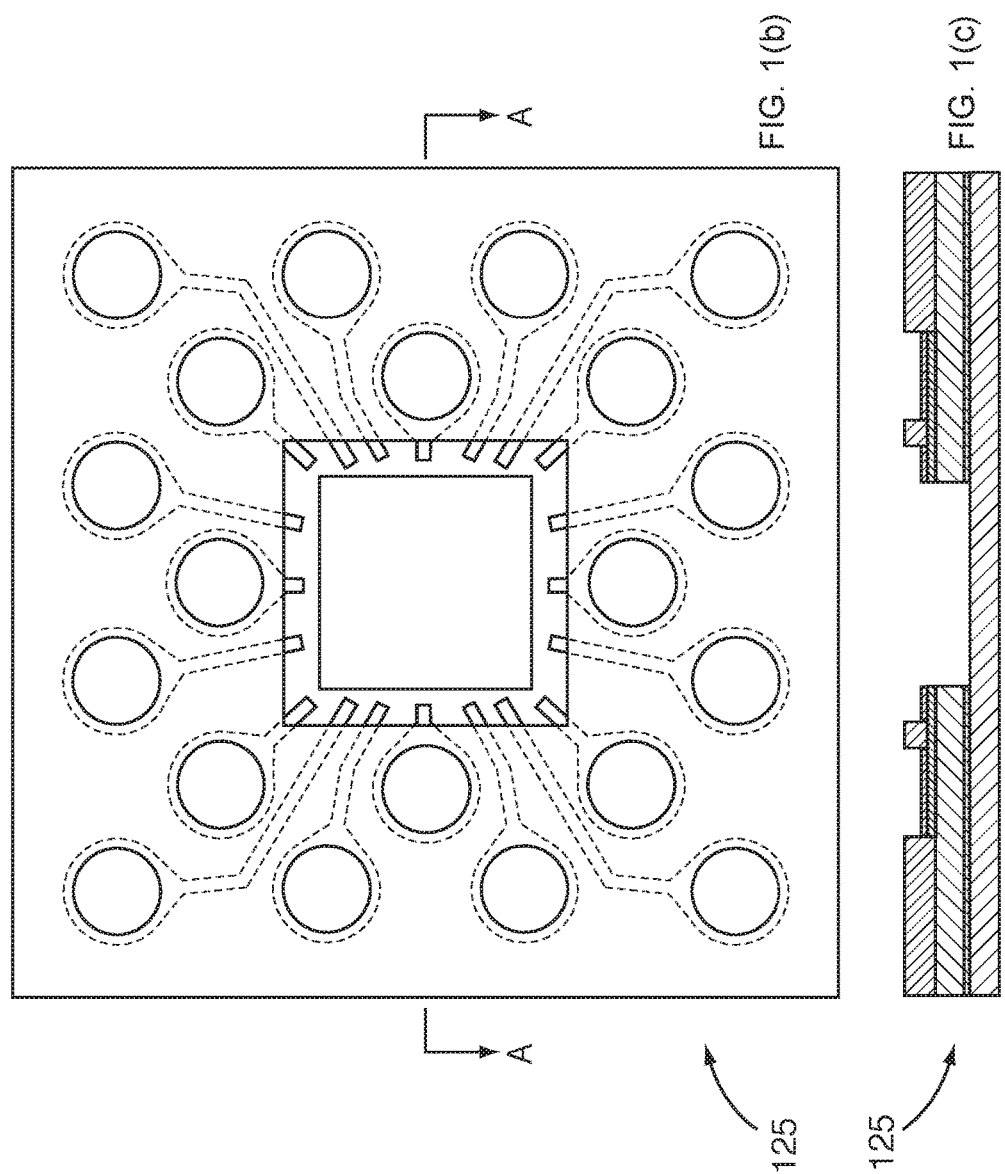

FIG. 1(a) shows a perspective top view of a ball grid array (BGA) carrier 125 in accordance with one implementation. FIG. 1(b) shows a top view and FIG. 1(c) is a cross-sectional view of carrier 125 across lines A-A in FIG. 1(b).

Figure 2:
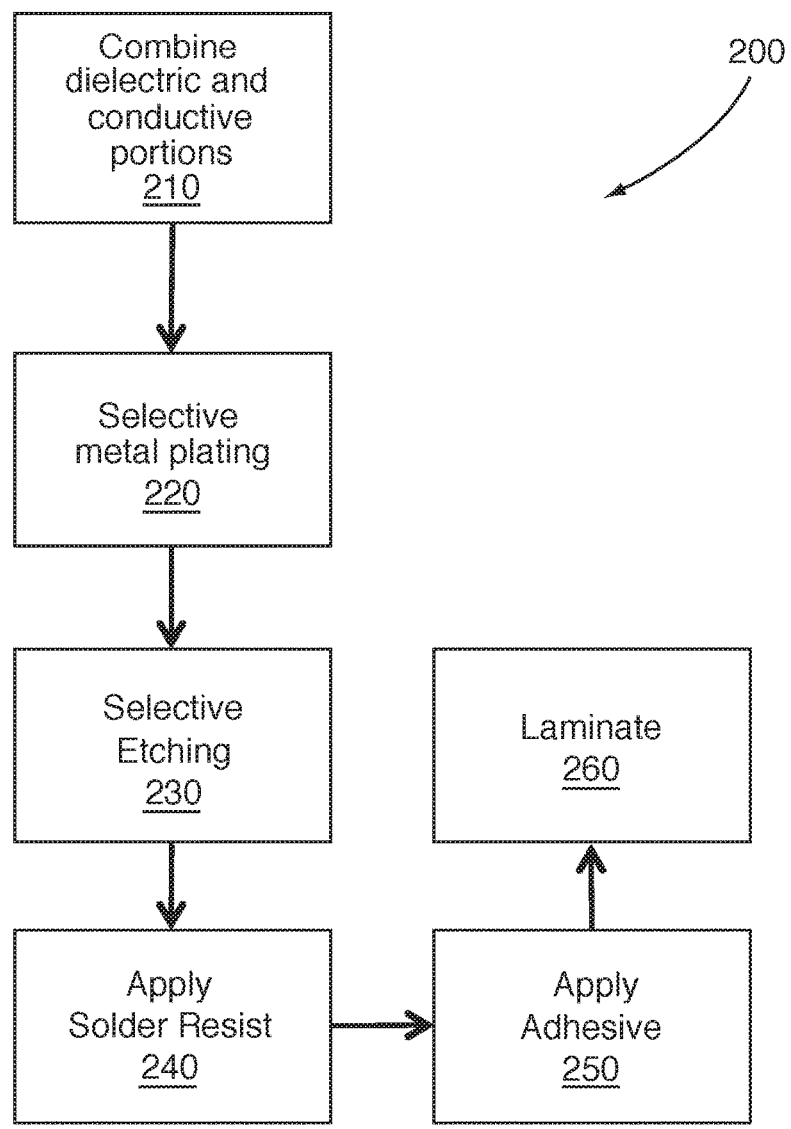
FIG. 2 is a flow chart showing a method of ball grid carrier fabrication in accordance with an embodiment.

Referring now to FIG. 2, a method of fabricating a cavity down BGA carrier is indicated generally at 200. It is to be understood that method 200 can be varied, and need not be performed exactly as discussed herein, and that such variations are within the scope of the invention.

At 210, a dielectric portion is combined with a conductive portion, as illustrated in FIG. 3(a), where a conductive portion 105, which can be made of metals such as copper, is combined directly with a dielectric portion 120. The dielectric portion 120 may be molded from a polymerized molding compound based, for example, on a binding material such as an epoxy and filled with inorganic fillers such as silicon dioxide or silicon carbide, or it may be any suitable plastic compound molded into a predetermined shape suitable to fabricate BGA carriers. The dielectric portion 120 can be formed into any predetermined thickness. An example thickness for dielectric portion 120 is approximately 0.1 mm. As shown in FIG. 3(a), the dielectric portion can be shaped so as to form a cavity or receptacle 110 in the middle such that the conductive portion 105 is exposed from both the top surface 135 and the bottom surface 140 of carrier 125 at the cavity 110.

Cavity 110 for receiving a die can be formed by an inner surface 111 of dielectric portion 120 which intersects the bottom surface 140 and the top surface 135 forming a top portal 112 and a bottom portal 113. In some implementations, such as the one shown in FIG. 3, inner surface 111 can be substantially orthogonal to the top and bottom surfaces. In other implementations, inner surface 111 can be angled in a manner that differs from orthogonal, namely non-orthogonally, such that the top portal 112 and the bottom portal 113 can have different circumferential dimensions. For example, inner surface 111 may be at an angle greater than 90 with respect to the bottom surface 135 allowing the bottom portal 113 to have a smaller circumference size with respect to the top portal 112. In this example, the inner surface 111 would intersect the top surface 135 at an angle less than 90 degrees. The inner surface 111 can be arranged in any predetermined manner to allow forming portals of any predetermined circumferential shape as defined by inner surface 111's intersection with a top and/or a bottom surface. Examples of circumferential shapes include a square, a rectangle, a triangle, a circle or an irregular shape. Moreover, top portal 112 can be of a different circumferential shape from the bottom portal 113 by forming the inner surface 111 in a manner to allow the shape difference. In some implementations, cavity 110 can have only one portal where the inner surface intersects one of the top surface 135 or the bottom surface 140, but not both.

In some implementations, as shown in FIG. 3(a) conductive portion 105 can be a metal foil such as a copper foil. The thickness of the foil can vary, for example, to be 18 um, 10 um or thinner. In further implementations, dielectric portion 120 is composed of a molding compound that can be molded by being exposed to high temperatures to reduce viscosity, for allowing the molding compound to be molded by a molding tool. In further implementations, dielectric portion 120 can be combined directly with the foil as the molding portion 120 can bind directly to the foil without the aid of an additional adhesive layer between the dielectric portion 120 and the foil. For example, in some variations, a binding material included in the molding material can facilitate the direct binding of dielectric portion 120 and the foil. In other implementations, as shown in FIG. 3(b), the conductive portion can be formed by metalizing the top surface of the dielectric portion 120. The metallization can be achieved by either sputtering on the dielectric portion 120 a metal seed layer 115 (such as copper or chromium or titanium) or by immersion metal plating using metals such as copper. The seed layer 115 or the immersion plating can be followed by further electrolytic plating with copper or similar metals to achieve the required thickness.

At 220, the exposed the top surface of conductive portion 105, namely the top surface 135 of carrier 125, can be selectively plated as illustrated FIG. 3(c), where the selective plating is indicated at 155. Metal plating 155 can be selectively deposited on at least portions of conductive portion 105, which in the illustrated embodiment is a metal foil. In some implementations, the plating 155 can be shaped to form bonding fingers and BGA pads. In some variations, to carry out selective plating, a photo-imageable plating resist is applied to the top surface of the carrier 125. The top surface 135 is then exposed to a pre-determined or selected image pattern. Next, the plating resist is developed and the specified metal pattern is plated as indicated at 155. The metal used can be Ag, Ni/Au, Pd or others that will be known to a person of skill in the art. Finally, the plating resist is stripped away.

At 230, at least some of conductive portion 105 is selectively etched away as indicated at 145 in FIG. 3(d). In some implementations, in order to carry out selectively etching of the conductive portion 105 in accordance with a predetermined pattern, photo imageable etching resist is applied to the top surface 135 and a selected image pattern is exposed. Then, the etching resist is developed and the metal pattern defined by the etching resist is exposed. Finally, the etching resist on the top surface 135 is stripped away.

At 240, solder resist can be applied selectively in accordance with a predetermined shape or pattern to the top surface 135 using traditional methods. FIG. 4(a) shows solder resist as applied to the top surface 135 of carrier portion 125, indicated at 160. In some implementations, the solder resist application is shaped such that areas of the conductive portion forming BGA pads 163 and bonding fingers 166 are left exposed at the top surface 135 of carrier 125.

At 250 of method 200, and as indicated at 170 in FIG. 4(b), an adhesive layer such as thermoset epoxy or film is applied to the exposed bottom surface 140 of the dielectric portion 120. At 260, a heat spreader 175 such as copper, Kovar® or material with high thermal conductivity and low CTE mismatch with the semiconductor device to be attached, is subsequently applied to the bottom surface 140 of the adhesive layer as shown in FIG. 4(c) completing the formation of a carrier 125 as shown in FIG. 1.

The carrier 125, as shown in FIG. 1 can be assembled as shown in FIG. 5. First, a die attach adhesive or epoxy 180 can be placed on the top surface 135 of the cavity, to which a die 185 can be attached, as shown in FIG. 5(a). Next, bonded wires 190 can be applied to the die and to the bonding fingers 166 to connect the pad bond pads on the die to the bonding traces on the carrier 125, as shown in FIG. 5(b). Bonded wires can be composed of Au, Cu or Ag, for example. An encapsulant 195 can then encapsulate or passivate the die 185, the bonded wires 190 and at least a portion of bonding fingers 166 as shown in FIG. 5(c), using for example, over molding or dispensing liquid type encapsulant followed by temperature curing. Solder balls 197 can also be attached to the BGA pads 163 using flux followed by reflow, for example, as shown in FIG. 5(d). Solder metal used can include SnAg, Cu, SnCu and others that will be known to a person of skill in the art.

In variations, following the application of solder resist as illustrated in FIG. 4(a) and repeated in FIG. 6(a), a temporary tape 198 having adhesive on one side, for example, can be laminated onto the bottom surface 140 of carrier portion 125, as indicated at FIG. 6(b). A die 185 can be attached to the top surface of the temporary tape 198 with adhesive or epoxy, as shown in FIG. 6(c). Next, bonded wires 190 can be applied to the die and the bonding fingers 166 to connect the pad bond pads on the die to the bonding traces on the carrier portion 125, as shown in FIG. 6(d).

An encapsulant 195 can then encapsulate or passivate the die 185, the bonded wires 190 and at least a portion of bonding fingers 166 as shown in FIG. 6(e), using for example, over molding or dispensing liquid type encapsulant followed by temperature curing. Solder balls 197 can also be attached to the BGA pads 163 using flux followed by reflow, for example as shown in FIG. 6(f). At this point, the temporary tape 198 can be removed using known methods as indicated in FIG. 6(g).

Finally, referring to FIG. 7, a heat sink 199 can be attached. The heat sink 199 can be attached with or without a heat spreader 175 as indicated in FIGS. 7(a) and 7(b), respectively. In some implementations, the heat sink 199 can be applied using a thermal interface material 191 such as thermal compound.

The above-described embodiments are intended to be examples and alterations and modifications may be effected thereto, by those of skill in the art, without departing from the scope which is defined solely by the claims appended hereto. For example, methods, systems and embodiments discussed can be varied and combined, in full or in part.

I claim:

1. A method of fabricating a receptacle down BGA carrier having a top surface and a bottom surface, the method comprising:
   combining a conductive portion and a molded dielectric portion, the dielectric portion having an inner surface intersecting the top surface, the inner surface forming a cavity for receiving a die;
   selectively etching part of the conductive portion; and
   applying solder resist to a portion of a top surface of the conductive portion; wherein
   the step of applying solder resist to the top surface is performed selectively in accordance with a predetermined shape;
   the predetermined shape is such that areas of the conductive portion forming BGA pads and bonding fingers are left exposed at the top surface; and
   following the application of solder resist, a temporary tape having adhesive on one side, is laminated onto the bottom surface.

2. The method of claim 1, further including attaching a semiconductor die to the top surface of the temporary tape with one of either adhesive or epoxy.

3. The method of claim 2, further including wire bonding to connect bond pads on the die to the bonding fingers via bonded wires.

4. The method of claim 3, further including encapsulating the die, the bonded wires and at least a portion of bonding fingers with an encapsulant.

5. The method of claim 4, further including attaching solder balls to the BGA pads using flux followed by reflow, and removing the temporary tape.

6. The method of claim 5, further including attaching a heat sink to the top surface using a thermal interface material.

\* \* \* \* \*